(12) United States Patent
Chen et al.

(10) Patent No.: US 11,475,888 B2
(45) Date of Patent: Oct. 18, 2022

(54) SPEECH PRE-PROCESSING IN A VOICE INTERACTIVE INTELLIGENT PERSONAL ASSISTANT

(71) Applicant: DSP Group Ltd., Herzliya (IL)

(72) Inventors: Yaakov Chen, Raanana (IL); Dima Khaykin, Beer Sheva (IL)

(73) Assignee: DSP GROUP LTD., Herzliya (IL)

( * ) Notice: Subject to any disclaimer, the term of this patent is extended or adjusted under 35 U.S.C. 154(b) by 293 days.

(21) Appl. No.: 16/396,808

(22) Filed: Apr. 29, 2019

(65) Prior Publication Data

US 2019/0333504 A1  Oct. 31, 2019

Related U.S. Application Data (60) Provisional application No. 62/664,180, filed on Apr. 29, 2018.

(51) Int. Cl.
| | |
|---|---|
| *G10L 15/22* | (2006.01) |
| *G10L 15/08* | (2006.01) |
| *G10L 21/0364* | (2013.01) |

(52) U.S. Cl.
CPC .............. *G10L 15/22* (2013.01); *G10L 15/08* (2013.01); *G10L 21/0364* (2013.01); *G10L 2015/088* (2013.01); *G10L 2015/223* (2013.01)

(58) Field of Classification Search
CPC ..... G10L 15/22; G10L 15/08; G10L 21/0364; G10L 2015/088; G10L 2015/223
See application file for complete search history.

(56) References Cited

U.S. PATENT DOCUMENTS

| | | | | |
|---|---|---|---|---|
| 2008/0235011 A1* | 9/2008 | Archibald | ............... | G10L 25/78 704/225 |
| 2009/0010453 A1* | 1/2009 | Zurek | ................. | G10L 21/0208 381/94.5 |
| 2010/0248786 A1* | 9/2010 | Charriere | ................ | G10L 15/30 455/563 |
| 2011/0150242 A1* | 6/2011 | Zong | ........................ | H03G 9/02 381/107 |
| 2012/0123769 A1* | 5/2012 | Urata | ................... | H03G 3/3089 704/E19.039 |
| 2014/0149111 A1* | 5/2014 | Matsuo | ............... | G10L 21/0232 704/206 |
| 2016/0314805 A1* | 10/2016 | Mortazavi | ............... | G10L 25/78 |
| 2016/0379635 A1* | 12/2016 | Page | .................... | G10L 15/063 704/251 |
| 2018/0033424 A1* | 2/2018 | Pechanec | ................. | H03G 3/32 |
| 2020/0227065 A1* | 7/2020 | Christoph | ................ | H03G 3/32 |

FOREIGN PATENT DOCUMENTS

JP  5457923 B2 *  4/2014

* cited by examiner

*Primary Examiner* — Sonia L Gay
(74) *Attorney, Agent, or Firm* — Paradice and Li LLP (57) ABSTRACT

A method for speech level adaptation, the method includes: (A) Receiving, by a voice interactive intelligent personal assistant, multiple input audio signals that includes first and second groups of input audio signals. (B) Buffering the multiple input audio signals. (C) Searching for a voice trigger in the first group of input audio signals. When finding the voice trigger then (D) Determining a linear gain factor to be applied on the second group of buffered audio signals, (E) Applying the linear gain factor on the second group of buffered audio signals to provide the output audio signals; and (F) applying a speech recognition process on the output audio signals to detect an audio command embedded in the output audio signals.

21 Claims, 5 Drawing Sheets

SPEECH PRE-PROCESSING IN A VOICE INTERACTIVE INTELLIGENT PERSONAL ASSISTANT

CROSS REFERENCE

This application claims priority from U.S. provisional patent Ser. No. 62/664,180 filing date Apr. 29, 2018.

BACKGROUND

Voice interactive Intelligent Personal Assistants are also known as voice interactive automated personal assistant are may be or may include a mobile software agent that can perform tasks, or services, on behalf of an individual based on a combination of user input (that may include voice commands or queries (that are preceded by voice trigger), location awareness, and the ability to access information from a variety of online sources (such as weather conditions, traffic congestion, news, stock prices, user schedules, retail prices, etc.). See—Wikipedia.org.

Voice interactive Intelligent Personal Assistants may include, for example, SIRI™ of APPLE™ GOOGLE HOME™ of GOOGLE™, ALEXA™ of AMAZON™, CORTANA™ of MICROSOFT™, S VOICE™ of SAMSUNG™, G3's VOICE MATE™ of LG™, ASSISTANT™ of BLACKBERRY™, WATSON™ of IBM™, and more.

A typical interaction with a voice interactive intelligent personal assistant includes saying a voice trigger (such as predefined word) that is followed by an audio query or an audio command that is aimed to the voice interactive intelligent personal assistant.

The voice interactive intelligent personal assistant applies an automatic speech recognition engine on the input audio signals received by the voice interactive intelligent personal assistant in order to detect (at least) the query or command.

The voice interactive intelligent personal assistant is required to properly interpret speech that is generated from different ranges and/or speech that may have a sound pressure level that is within a very large dynamic range (for example—a dynamic range that may exceed 40 dB).

There is a growing need to provide a method and system for pre-processing speech signals before they are fed to the automatic speech recognition engine.

SUMMARY

A voice interactive Intelligent Personal Assistants, and a computer readable medium as illustrated in the specification and/or drawings and/or claims.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Any reference in the specification to a system should be applied mutatis mutandis to a method that can be executed by the system and to a non-transitory medium that stores instructions for executing the method.

Any reference in the specification to a method should be applied mutatis mutandis to a system capable of executing the method and to a non-transitory medium that stores instructions for executing the method.

Because the illustrated at least one embodiment of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

There may be provided a method and a system that linearly pre-processes input audio signals to provide output audio signals that may be fed to an automatic speech recognition engine.

The linear pre-processing receives input audio signals and amplifies them or attenuates them to generate output audio signals of a one or more desired parameters (for example—be of a desired level or within a predefined range of levels) without introducing non-linear distortions that may distort the sound signals and hamper (and even prevent) the automatic speech recognition. The one or more desired parameters of the output audio signals may be an average level, a maximal level, a range of levels, and the like.

Thus—in contrary to non-linear amplification schemes such as automatic gain control (AGC) and dynamic range control (DRC)—the suggested pre-processing does not introduce non-linear distortion—and eases the recognition of the query or command by the voice interactive intelligent personal assistance.

The pre-processing may include:
a. Detecting a voice trigger.
b. Determining a gain factor (that may be below one, may equal one or may exceed one) based on one or more parameter of the voice trigger (for example—maximal intensity, average intensity, intensity variation, mean intensity, and the like) and based on one or more parameters of the output audio signals (for example desired level, desired range of levels).

c. Applying the gain factor on the voice trigger and on the query or command that follows the voice trigger.

The pre-processing may also include verifying (for example after applying the gain factor on the voice trigger) the voice trigger—and terminating the session (for example cancelling or not starting the automatic speech recognition engine) when the voice trigger is not verified.

The detecting of the voice trigger may involve processing sampled audio signals that are stored in a buffer. The buffer is used to buffer input audio signals—and may also include the query or command.

Figure 1:
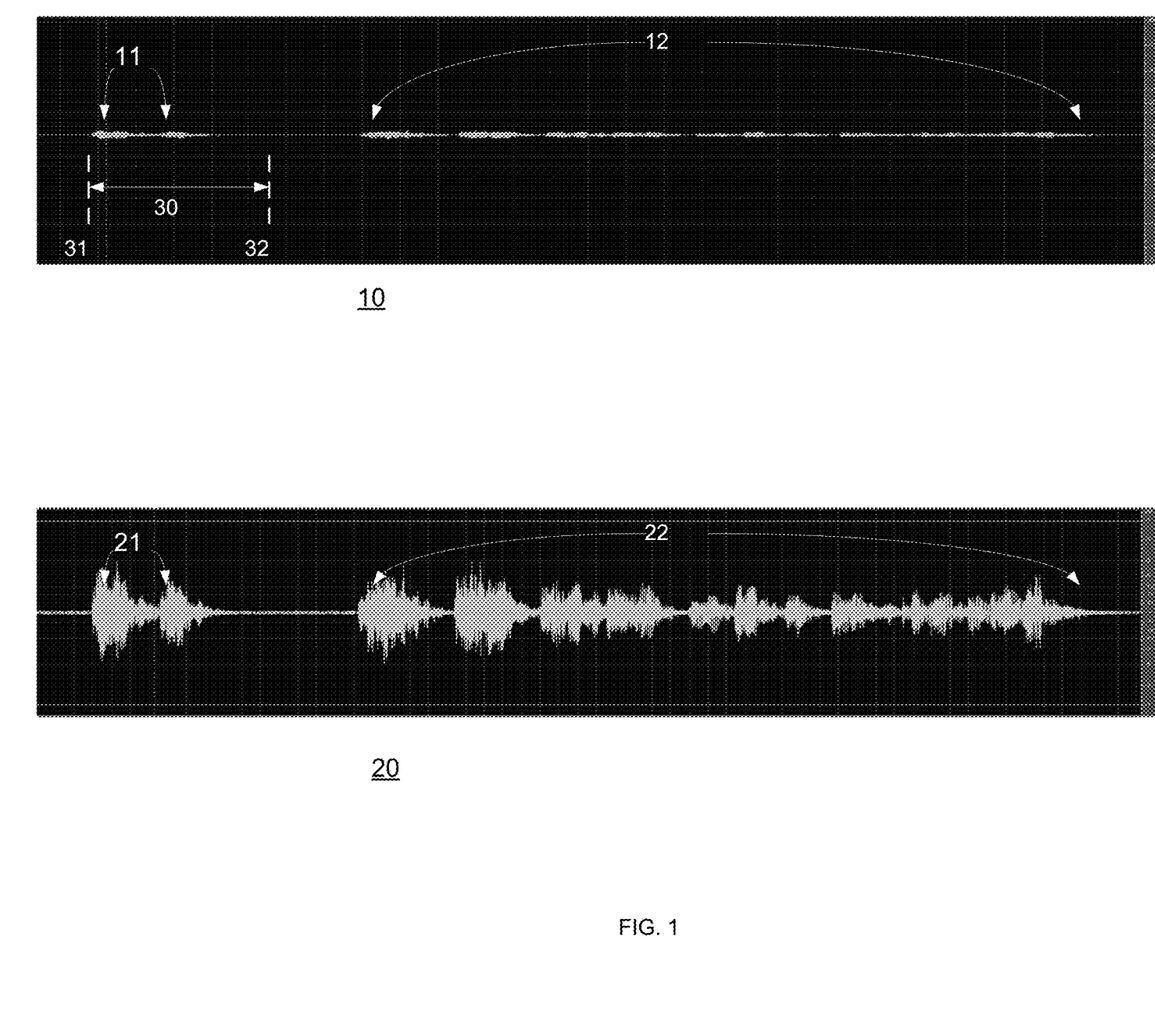
FIG. 1 is an example of audio signals of non-optimal levels and of optimal levels, both signals include a voice trigger that is followed by a query or command.

FIG. 1 is an example of multiple input audio signals 10 (or buffered input audio signals) of non-optimal levels and gain applied audio signals 20—that may be regarded as having optimal levels. It should be noted that the gain applied audio signals 20 may have sub-optimal levels.

A gain applied audio signal is generated by applying a linear gain factor on an input audio signal.

In FIG. 1, the input audio signals include a first group of input audio signals 11, and a second group of input audio signals 12.

The first group of input audio signals 11 may include a voice trigger.

The second group of input audio signals 12 may include a command or a query.

Figure 2:
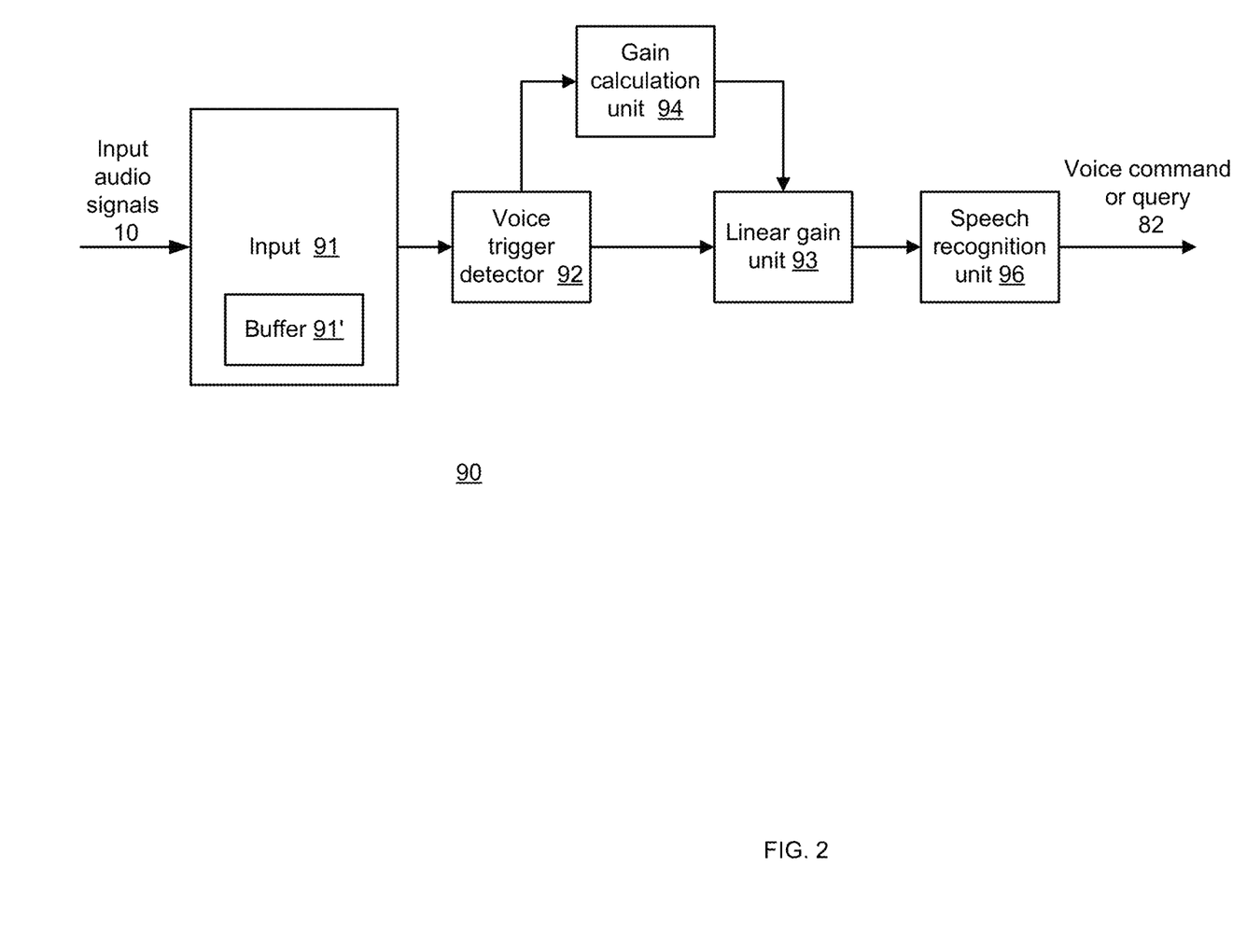
FIG. 2 illustrates an example of a voice interactive intelligent personal assistants.

In FIG. 2, the gain applied audio signals include a first group of gain applied audio signals 21, and a second group of gain applied audio signals 22.

The first group of gain applied audio signals 21 may include a voice trigger.

The second group of gain applied audio signals 22 may include a command or a query. The second group of gain applied audio signals 22 are also referred to as output audio signals.

It should be noted that the linear gain may or may not be applied on the first group of input audio signals. Thus—the first group of gain applied audio signals 21 may or may not be generated.

FIG. 1 also illustrates that a buffer that is used to stores the multiple input audio signals should be able to store input audio signals received over a time period of a length that is not smaller than a time gap 30 between a start (31) of the voice trigger and a completion (32) of the searching for the voice trigger.

FIG. 2 illustrates an example of voice interactive intelligent personal assistant 90.

Voice interactive intelligent personal assistant 90 includes buffer 91', voice trigger detector 92, gain calculation unit 92, linear gain unit 93, and speech recognition unit 96.

Buffer 91' is shown as being included in input 91 of the voice interactive intelligent personal assistant 90. Buffer 91' may not belong to input 91. Input may not be included in the voice interactive intelligent personal assistant 90.

Buffer 91' is configured to (i) receive multiple input audio signals that comprise a first group of input audio signals and a second group of input audio signals, the second group of audio signals follow the first group of input audio signals, and to (ii) buffer the multiple input audio signals to provide a first group of buffered audio signals and a second group of buffered audio signals;

Voice trigger detector 92 is configured to search for a voice trigger in the first group of input audio signals.

When the voice trigger detector detects the voice trigger the gain calculation unit 94 is configured to determine a linear gain factor to be applied on the second group of buffered audio signals; wherein the determining is based on a relationship between (i) a value of a property of the first group of buffered audio signals, and (ii) a desired value of a property of audio output signals, wherein the audio output signals are generated by applying the linear gain factor on the second group of buffered audio signals.

When the voice trigger detector detects the voice trigger the linear gain unit 93 is configured to apply the linear gain factor on the second group of buffered audio signals to provide the output audio signals.

When the voice trigger detector detects the voice trigger the speech recognition unit 96 is configured apply a speech recognition process on the output audio signals to detect an audio command or query (82) embedded in the output audio signals.

The buffer 91' is configured to buffer the multiple input signals for a duration that substantially equals a time gap between a start of the voice trigger and a completion of the searching for the voice trigger.

The property of the first group of buffered audio signals may equal the property of the audio output signals—or may differ from the property of the audio output signals.

The property of the first group of buffered audio signals may be a maximal intensity of the first group of buffered audio signals, an average intensity of the first group of buffered audio signals, an intensity variation of the first group of buffered audio signals, or any other parameter.

It should be noted that the determination may be responsive to the relationships between (a) one or more value of one or more properties of the first group of buffered audio signals, and (b) one or more desired values of one or more properties of audio output signals.

Upon failure to find the voice trigger (by the voice trigger detector) the gain calculation unit 94, the linear gain unit 93 and the speech recognition units 96 may be idle. Idle may mean lowering a lower power consumption, being shut down, and the like.

Figure 3:
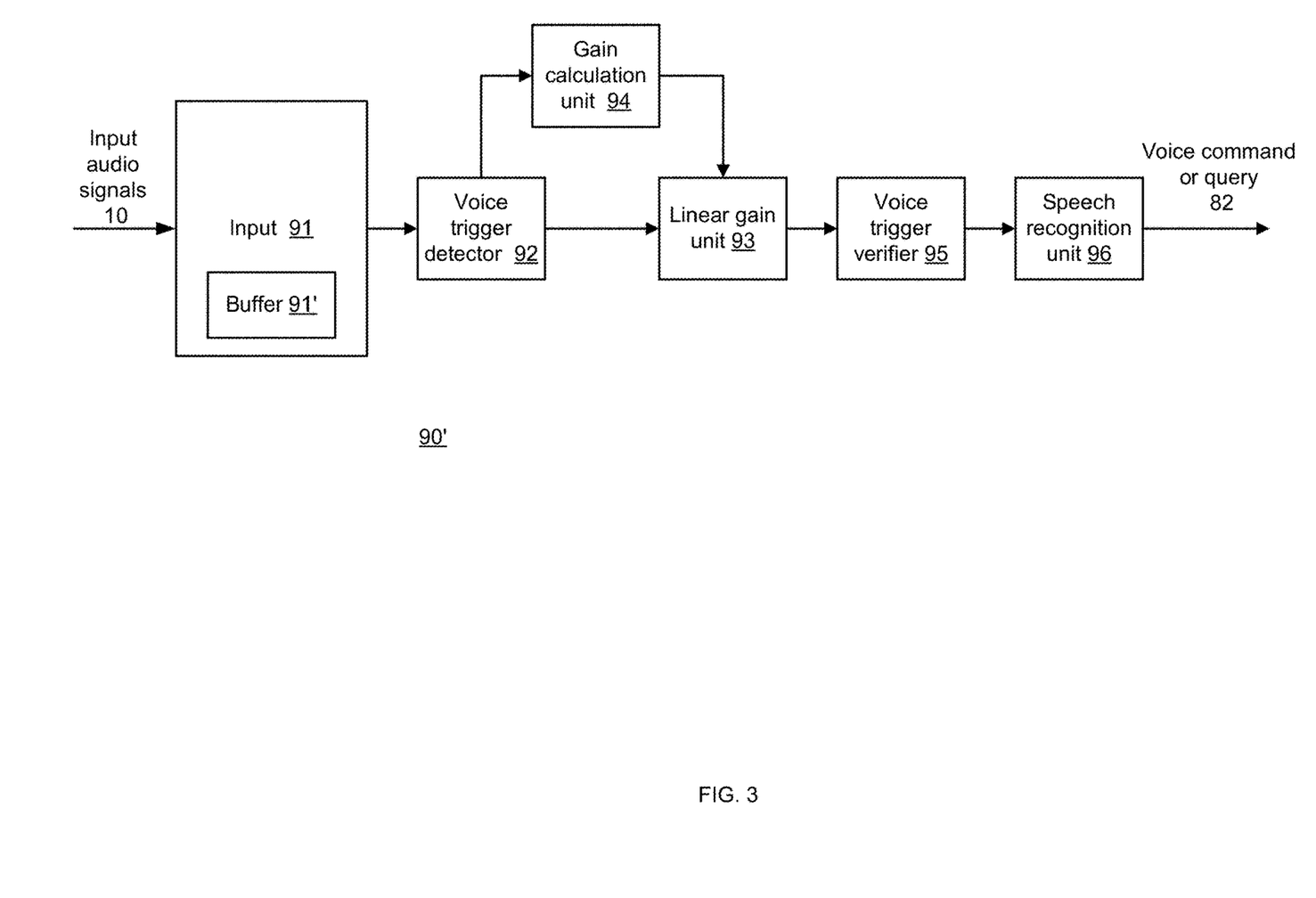
FIG. 3 illustrates an example of a voice interactive intelligent personal assistants.

FIG. 3 illustrates an example of voice interactive intelligent personal assistant 90'.

The voice interactive intelligent personal assistant 90' differ from voice interactive intelligent personal assistant 90 of FIG. 2 by having a voice trigger verifier 95.

The voice trigger verifier 95 is configured to verify that the output audio signals represent the voice trigger. Because of the pre-processing the verification is more reliable than the voice trigger detection. When the verification fails (no voice trigger is found in the output audio signals) the speech recognition unit does not complete (or even does not start) the applying of the speech recognition process.

Figure 4:
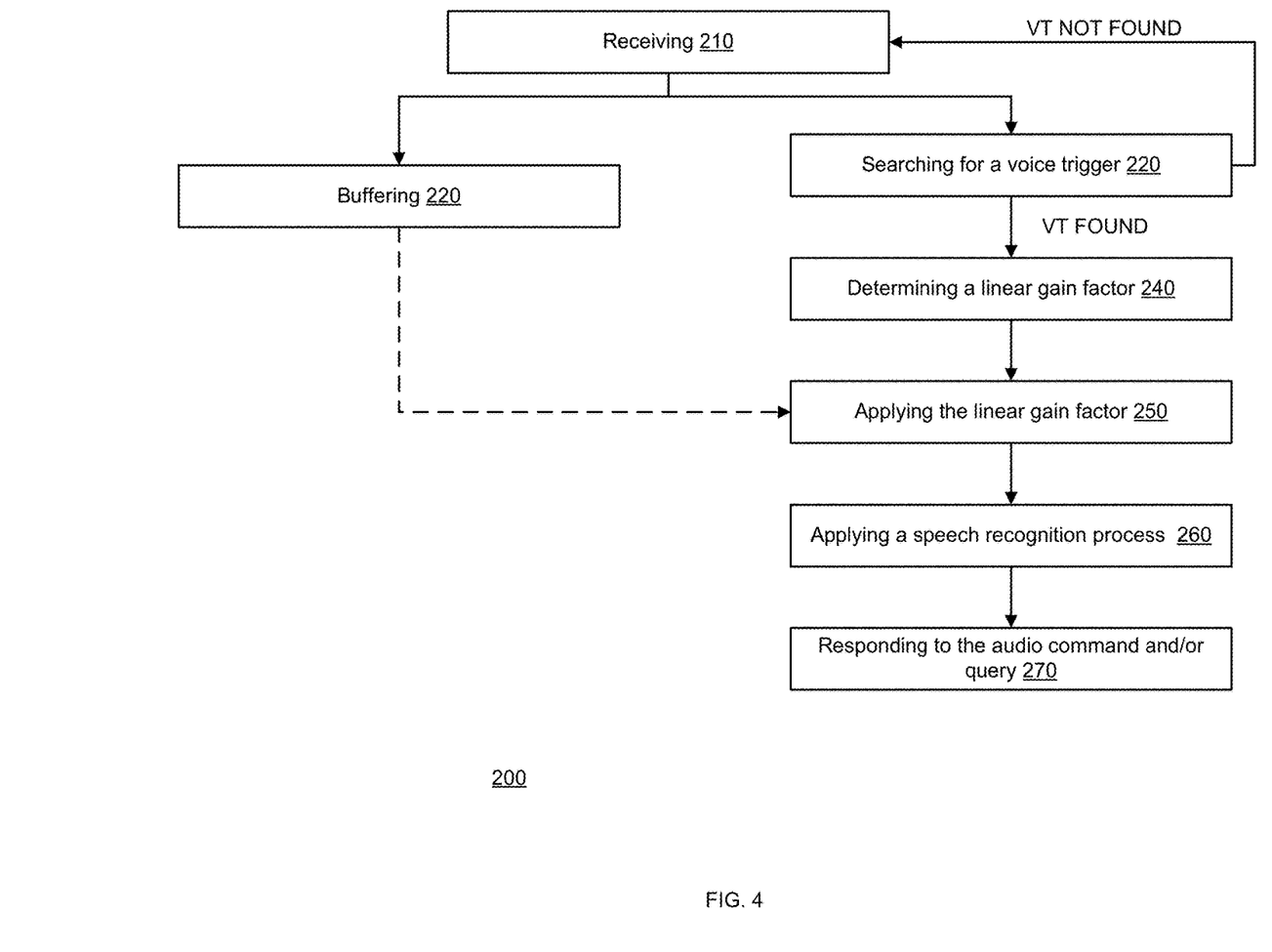
FIG. 4 illustrates an example of a method.

FIG. 4 illustrates an example of a method 200.

Method 200 may include steps 210, 220, 230, 240, 250, 260 and 270.

Step 210 may include receiving, by a voice interactive intelligent personal assistant, multiple input audio signals that comprise a first group of input audio signals and a second group of input audio signals, the second group of audio signals follow the first group of input audio signals.

Step 210 may be repeated multiple times—as the reception of input audio signals may continue—even regardless to the other steps of method 200.

Step 210 may be followed by steps 220 and 230.

Step 220 may include buffering the multiple input audio signals to provide a first group of buffered audio signals and a second group of buffered audio signals.

Step 230 may include searching for a voice trigger in the first group of input audio signals.

When a voice trigger is not found, step 230 may be followed by jumping to step 210.

When finding the voice trigger then step 230 may be followed by step 240 of determining a linear gain factor to be applied on the second group of buffered audio signals.

The determining is based on a relationship between (i) one or more values of one or more properties of the first group of buffered audio signals, and (ii) one or more desired values of one or more properties of audio output signals. The audio output signals are generated by applying the linear gain factor on the second group of buffered audio signals.

Any desired value of a property of the audio output signals may be determined in various manners—by a user of the voice interactive intelligent personal assistant, by a designer of the voice interactive intelligent personal assistant, or any other person or entity.

The desired value may be determined one or more during the lifespan of the voice interactive intelligent personal assistant. The desired value may be responsive to the properties of the voice interactive intelligent personal assistant—for example—saturation level, dynamic range, distortions, history of speech recognition attempts, and the like.

Step 240 may be followed by step 250 of applying the linear gain factor on the second group of buffered audio signals to provide the output audio signals. A dashed line from step 220 emphasizes that step 250 is applied on the buffered audio signals.

Step 250 may or may not include applying the linear gain factor on the first group of buffered audio signals.

Step 250 may be followed by step 260 of applying a speech recognition process on the output audio signals to detect an audio command and/or query embedded in the output audio signals.

Step 260 may be followed by step 270 of responding to the audio command and/or query.

The responding may or may not involve communicating with a remote computerized system, receiving a response from the remote computerized system, and the like.

Figure 5:
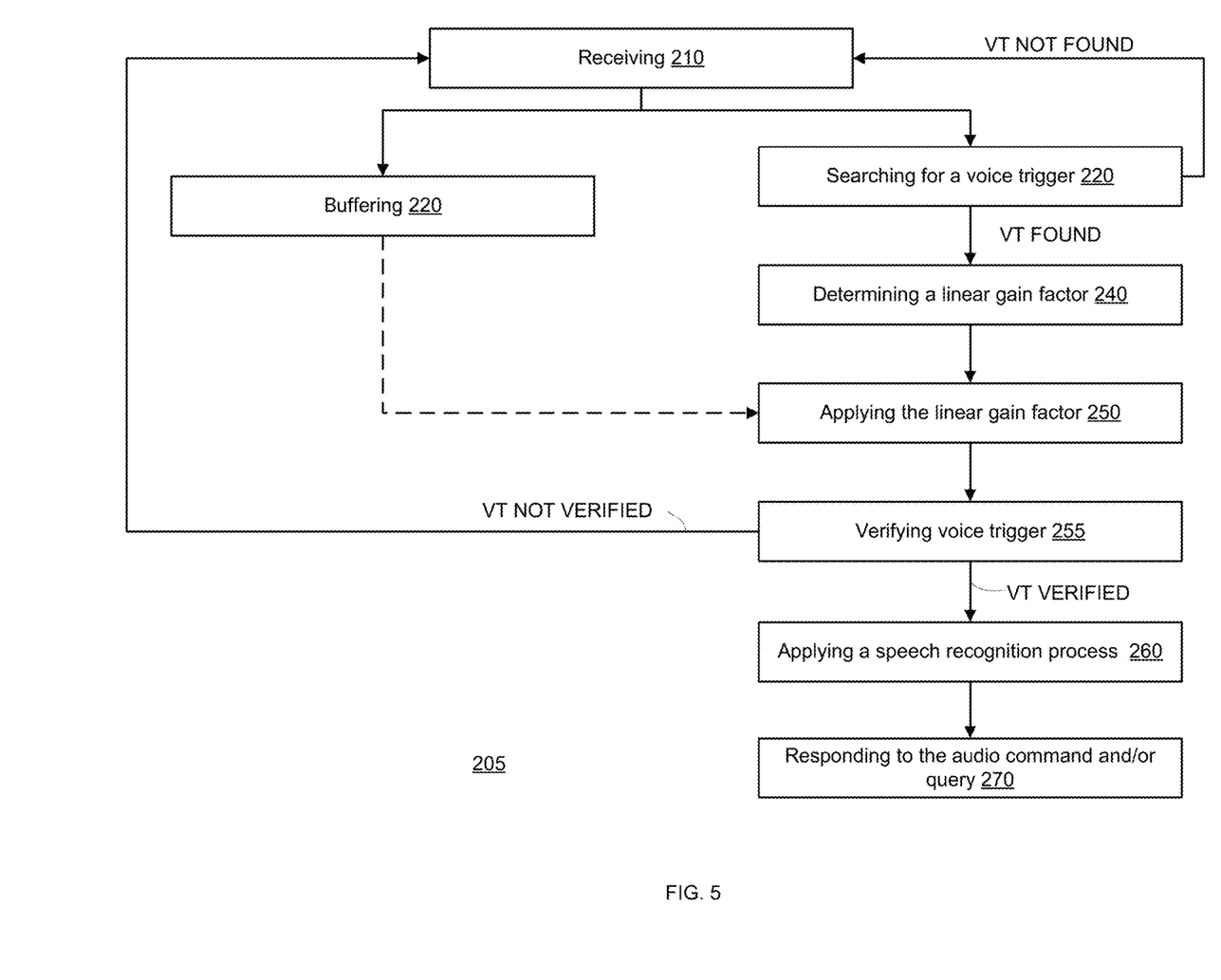
FIG. 5 illustrates an example of a method.

FIG. 5 illustrates an example of a method 205.

Method 205 differs from method 200 by including step 255 between steps 250 and 260.

Step 255 may include verifying that the output audio signals represent the voice trigger.

If the verification succeeded (voice trigger found in the output audio signals) then step 255 is followed by step 260.

If the verification fails, then step 265 is not followed by step 270—but may be followed by step 210.

Alternatively, step 270 may start before a completion of step 265—and when the verification fails—the execution of step 270 is stopped before a completion of step 270.

The voice interactive intelligent personal assistant may include at least one processing circuit that may be a central processing unit, a graphic processing unit, a controller, an FPGA, an ASIC, a hardware accelerator, a part of an integrated circuit, one or more integrated circuits, and the like. The at least one processing circuit may be configured to execute instructions stored on a computer-readable storage medium to perform functions of a voice trigger detector, a gain calculation unit, a linear gain unit, and/or a speech recognition unit. As shown in FIG. 2, Voice trigger detector 92 is configured to search for a voice trigger in the first group of input audio signals, gain calculation unit 94 is configured to determine a linear gain factor to be applied on the second group of buffered audio signals, linear gain unit 93 is configured to apply the linear gain factor on the second group of buffered audio signals to provide the output audio signals, and speech recognition unit 96 is configured apply a speech recognition process on the output audio signals to detect an audio command or query (82) embedded in the output audio signals.

Any reference to any of the terms "comprise", "comprises", "comprising" "including", "may include" and "includes" may be applied to any of the terms "consists", "consisting", "and consisting essentially of".

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between MEMS elements are merely illustrative and that alternative embodiments may merge MEMS elements or impose an alternate decomposition of functionality upon various MEMS elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also, for example, in one embodiment, the illustrated examples may be implemented as circuitry located on a single device. Alternatively, the examples may be implemented as any number of separate devices or separate devices interconnected with each other in a suitable manner. However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for speech pre-processing, the method comprises:
    receiving, by a voice interactive intelligent personal assistant, multiple input audio signals that comprise a first group of input audio signals and a second group of input audio signals, the second group of input audio signals follows the first group of input audio signals;
    buffering the multiple input audio signals to provide a first group of buffered audio signals and a second group of buffered audio signals;
    searching for a voice trigger in the first group of buffered audio signals;
    when finding the voice trigger then:
        determining a linear gain factor to be applied on the second group of buffered audio signals; wherein the determining is based on a relationship between (i) a value of a time-domain property of the first group of buffered audio signals, and (ii) a desired value of a time-domain property of audio output signals, wherein the audio output signals are generated by applying the linear gain factor on the second group of buffered audio signals; and
        applying a speech recognition process on the output audio signals to detect an audio command embedded in the output audio signals; and
    wherein the searching for the voice trigger, the determining of the linear gain factor and the applying of the linear gain factor are executed without introducing non-linear distortions to the second group of buffered audio signals.

2. The method according to claim 1, comprising verifying that the output audio signals represent the voice trigger; and stopping the applying of the speech recognition process when the verifying fails.

3. The method according to claim 1, comprising verifying that the output audio signals represent the voice trigger; and preventing from starting the applying of the speech recognition process when the verifying fails.

4. The method according to claim 1, wherein the buffering is for a duration that substantially equals a time gap between a start of the voice trigger and a completion of the searching for the voice trigger.

5. The method according to claim 1, wherein the time-domain property of the first group of buffered audio signals equals the time-domain property of the audio output signals.

6. The method according to claim 1, wherein the time-domain property of the first group of buffered audio signals differs from the time-domain property of the audio output signals.

7. The method according to claim 1, wherein the time-domain property of the first group of buffered audio signals is a maximal intensity of the first group of buffered audio signals.

8. The method according to claim 1, wherein the time-domain property of the first group of buffered audio signals is an average intensity of the first group of buffered audio signals.

9. The method according to claim 1, wherein the time-domain property of the first group of buffered audio signals is an intensity variation of the first group of buffered audio signals.

10. The method according to claim 1, wherein when failing to find the voice trigger then preventing from executing the determining of the linear gain factor, the applying of the linear gain factor, and the applying of the speech recognition process.

11. A non-transitory computer readable medium that stores instructions for:
    receiving, by a voice interactive intelligent personal assistant, multiple input audio signals that comprise a first group of input audio signals and a second group of input audio signals, the second group of input audio signals follows the first group of input audio signals;
    buffering the multiple input audio signals to provide a first group of buffered audio signals and a second group of buffered audio signals;
    searching for a voice trigger in the first group of buffered audio signals;
    when finding the voice trigger then:
        determining a linear gain factor to be applied on the second group of buffered audio signals; wherein the determining is based on a relationship between (i) a value of a time-domain property of the first group of buffered audio signals, and (ii) a desired value of a time-domain property of audio output signals, wherein the audio output signals are generated by applying the linear gain factor on the second group of buffered audio signals; and
        applying a speech recognition process on the output audio signals to detect an audio command embedded in the output audio signals; and
    wherein the searching for the voice trigger, the determining of the linear gain factor and the applying of the linear gain factor are executed without introducing non-linear distortions to the second group of buffered audio signals.

12. The non-transitory computer readable medium according to claim 11, that stores instructions for verifying that the output audio signals represent the voice trigger; and stopping the applying of the speech recognition process when the verifying fails.

13. The non-transitory computer readable medium according to claim 11, that stores instructions for verifying that the output audio signals represent the voice trigger; and preventing from starting the applying of the speech recognition process when the verifying fails.

14. The non-transitory computer readable medium according to claim 11, wherein the buffering is for a duration that substantially equals a time gap between a start of the voice trigger and a completion of the searching for the voice trigger.

15. The non-transitory computer readable medium according to claim 11, wherein the time-domain property of the first group of buffered audio signals equals the time-domain property of the audio output signals.

16. The non-transitory computer readable medium according to claim 11, wherein the time-domain property of the first group of buffered audio signals differs from the time-domain property of the audio output signals.

17. The non-transitory computer readable medium according to claim 11, wherein the time-domain property of the first group of buffered audio signals is a maximal intensity of the first group of buffered audio signals.

18. The non-transitory computer readable medium according to claim 11, wherein the time-domain property of the first group of buffered audio signals is an average intensity of the first group of buffered audio signals.

19. The non-transitory computer readable medium according to claim 11, wherein the time-domain property of the first group of buffered audio signals is an intensity variation of the first group of buffered audio signals.

20. The non-transitory computer readable medium according to claim 11, wherein when failing to find the voice trigger then preventing from executing the determining of the linear gain factor, the applying of the linear gain factor, and the applying of the speech recognition process.

21. A voice interactive intelligent personal assistant, comprising a buffer, and at least one processing circuit that is configured to act as a voice trigger detector, a gain calculation unit, a linear gain unit, and a speech recognition unit;
wherein the buffer is configured to (i) receive multiple input audio signals that comprise a first group of input audio signals and a second group of input audio signals, the second group of input audio signals follows the first group of input audio signals, and to (ii) buffer the multiple input audio signals to provide a first group of buffered audio signals and a second group of buffered audio signals;
wherein the voice trigger detector is configured to search for and detect a voice trigger in the first group of buffered audio signals;
wherein when the voice trigger detector detects the voice trigger:
the gain calculation unit is configured to determine a linear gain factor to be applied on the second group of buffered audio signals; wherein the determining is based on a relationship between (i) a value of a time-domain property of the first group of buffered audio signals, and (ii) a desired value of a time-domain property of audio output signals, wherein the audio output signals are generated by applying the linear gain factor on the second group of buffered audio signals; and
the speech recognition unit is configured apply a speech recognition process on the output audio signals to detect an audio command embedded in the output audio signals;
wherein the voice trigger detector is configured to search for the voice trigger without introducing non-linear distortions to the second group of buffered audio signals; and
wherein the gain calculation unit is configured to determine the linear gain factor and to apply the linear gain factor without introducing non-linear distortions to the second group of buffered audio signals.

* * * * *